United States Patent
Huang et al.

(10) Patent No.: US 12,327,802 B2
(45) Date of Patent: Jun. 10, 2025

(54) SEMICONDUCTOR STRUCTURE FOR DIE CRACK DETECTION

(71) Applicant: WIN SEMICONDUCTORS CORP., Taoyuan (TW)

(72) Inventors: Chu-Lung Huang, Taoyuan (TW); Pi-Hsia Wang, Taoyuan (TW)

(73) Assignee: WIN SEMICONDUCTORS CORP., Taoyuan (TW)

( * ) Notice: Subject to any disclaimer, the term of this patent is extended or adjusted under 35 U.S.C. 154(b) by 387 days.

(21) Appl. No.: 17/829,776

(22) Filed: Jun. 1, 2022

(65) Prior Publication Data
US 2023/0019796 A1 Jan. 19, 2023

Related U.S. Application Data

(60) Provisional application No. 63/219,029, filed on Jul. 7, 2021.

(51) Int. Cl.
| | |
|---|---|
| *H01L 23/00* | (2006.01) |
| *H01L 23/58* | (2006.01) |
| *H10D 10/80* | (2025.01) |
| *H10D 30/47* | (2025.01) |
| *H10D 62/85* | (2025.01) |

(52) U.S. Cl.
CPC .......... *H01L 23/562* (2013.01); *H01L 23/585* (2013.01); *H10D 10/80* (2025.01); *H10D 30/4732* (2025.01); *H10D 62/85* (2025.01)

(58) Field of Classification Search
CPC ..... H01L 23/562; H01L 23/585; H01L 29/20; H01L 29/737; H01L 29/7783; H01L 29/205; H01L 29/7371; H01L 22/30
See application file for complete search history.

(56) References Cited

U.S. PATENT DOCUMENTS

| | | | |
|---|---|---|---|
| 7,247,921 B2 | 7/2007 | Sugiura et al. | |
| 10,566,420 B2 | 2/2020 | Kotani et al. | |
| 10,714,603 B2 | 7/2020 | Naito | |
| 2004/0016941 A1* | 1/2004 | Yanagisawa | H01L 29/7371 257/E29.189 |
| 2016/0079675 A1 | 3/2016 | Van Zeijl et al. | |
| 2016/0258996 A1* | 9/2016 | Lim | G01R 31/2853 |
| 2019/0164911 A1* | 5/2019 | Pan | H01L 21/765 |

FOREIGN PATENT DOCUMENTS

WO 2018/061178 A1 4/2018

OTHER PUBLICATIONS

Chinese language office action dated Feb. 9, 2023, issued in application No. TW 111124204.
Chinese language office action dated Aug. 22, 2023, issued in application No. TW 111124204.

\* cited by examiner

*Primary Examiner* — Syed I Gheyas
(74) *Attorney, Agent, or Firm* — McClure, Qualey & Rodack, LLP

(57) ABSTRACT

A III-V semiconductor die for die crack detection is provided. The III-V semiconductor die includes a device area. The III-V semiconductor die further includes a doped semiconductor ring region. The doped semiconductor ring region surrounds the device area. At least one active device or at least one passive device is formed in the device area of the III-V semiconductor die.

18 Claims, 17 Drawing Sheets

SEMICONDUCTOR STRUCTURE FOR DIE CRACK DETECTION

CROSS REFERENCE TO RELATED APPLICATIONS

This application claims the benefit of U.S. Provisional Application No. 63/219,029, filed on Jul. 7, 2021, the entirety of which is incorporated by reference herein.

BACKGROUND OF THE INVENTION

Field of the Invention

The present invention relates to semiconductor structures for die crack detection.

Description of the Related Art

In conventional semiconductor processes, a cutting process (such as laser cutting) is employed to singulate the dies on a substrate. However, micro-cracks (e.g. hairline cracks) may form at the edges or corners of the die, and this can degrade the reliability of the die. Moreover, these hairline cracks may be an extension of a main crack, so it is important to detect such cracks. Therefore, the industry needs a structure for detecting cracks on a die.

BRIEF SUMMARY OF THE INVENTION

A III-V semiconductor die is provided in some embodiments of the present disclosure. The III-V semiconductor die includes a device area and a doped semiconductor ring region surrounding the device area. At least one active device or passive device is formed in the device area.

A III-V semiconductor die is provided in some embodiments of the present disclosure. The III-V semiconductor die has a device area and a doped semiconductor ring region surrounding the device area. The III-V semiconductor die includes a substrate, a sub-collector layer formed on the substrate, and a protective layer disposed on the sub-collector layer.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1A:
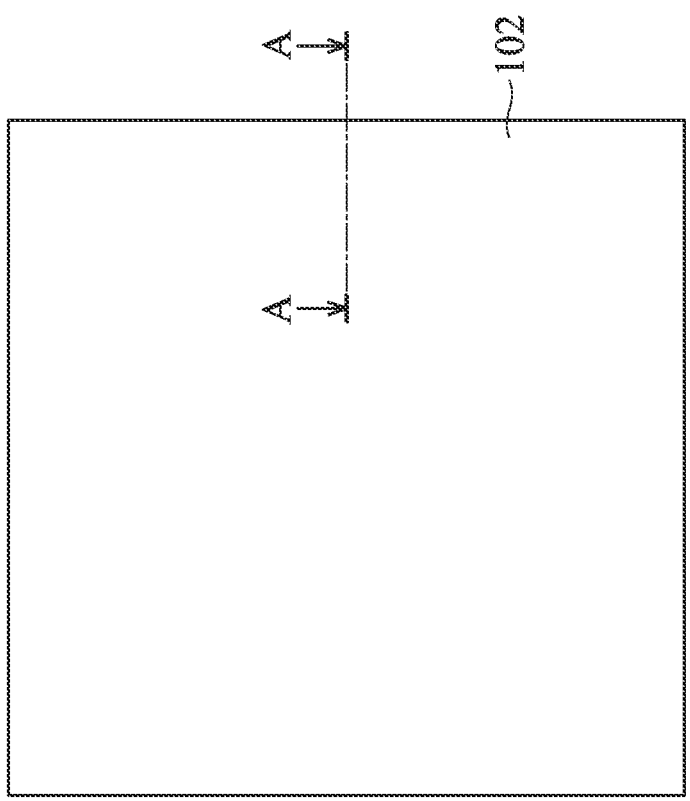
FIG. 1A, FIG. 2A, FIG. 3A, and FIG. 4A are top views of various stages of forming a semiconductor structure in some embodiments of the present disclosure.
Figure 1A:
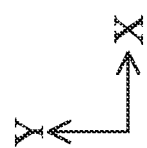

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are in direct contact, and may also include embodiments in which additional features may be disposed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are in direct contact, and may also include embodiments in which additional features may be disposed interposing the features, such that the features may not be in direct contact. In addition, spatially relative terms, for example, "vertical," "above," "over," "below,", "bottom," etc. as well as derivatives thereof (e.g., "downwardly," "upwardly," etc.) are used in the present disclosure for ease of description of one feature s relationship to another feature. The spatially relative terms are intended to cover different orientations of the device, including the features.

Use of ordinal terms such as "first", "second", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

A semiconductor structure (e.g. a III-V semiconductor die) is provided in some embodiments of the present disclosure. The semiconductor structure includes a ring element surrounding the active area of the semiconductor die, which may help detecting micro-cracks (e.g. hairline cracks) generated during the singulation of the dies, in accordance with some embodiments of the present disclosure.

FIG. 1A, FIG. 2A, FIG. 3A, and FIG. 4A are top views of various stages of forming a semiconductor structure 100A in some embodiments of the present disclosure. FIG. 1B, FIG. 2B, FIG. 3B, and FIG. 4B are cross-sectional views taken along line A-A of FIG. 1A, FIG. 2A, FIG. 3A, and FIG. 4A, respectively, in accordance with some embodiments of the present disclosure.

Figure 1B:
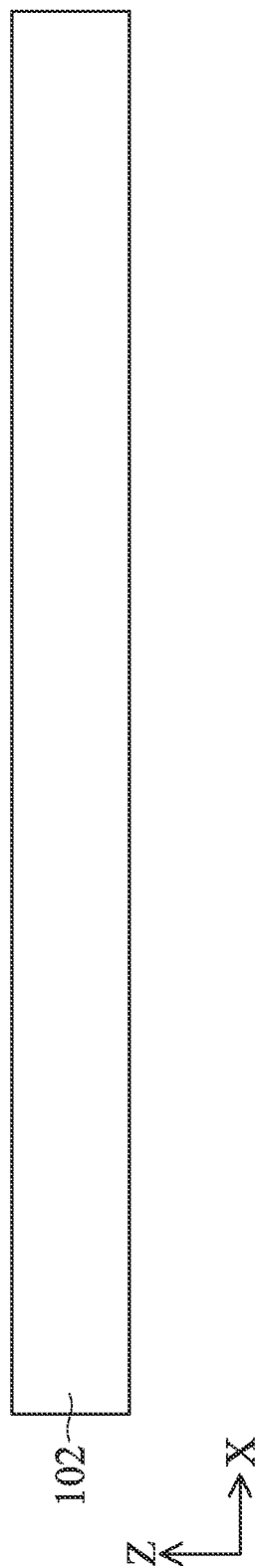
FIG. 1B, FIG. 2B, FIG. 3B, and FIG. 4B are cross-sectional views taken along line A-A of FIG. 1A, FIG. 2A, FIG. 3A, and FIG. 4A, respectively, in accordance with some embodiments of the present disclosure.

As shown in FIG. 1A and FIG. 1B, a substrate 102 is provided in some embodiments. In some embodiments, the substrate 102 is a semiconductor substrate. Moreover, the substrate 102 may include III-V semiconductors such as GaN, AlGaN, AlN, GaAs, AlGaAs, InP, InAlAs, InGaAs, or a combination thereof. In some embodiments, the substrate 102 includes undoped GaAs. Therefore, the semiconductor structure 100A (see FIG. 4A) may be a III-V semiconductor die.

Figure 2A:
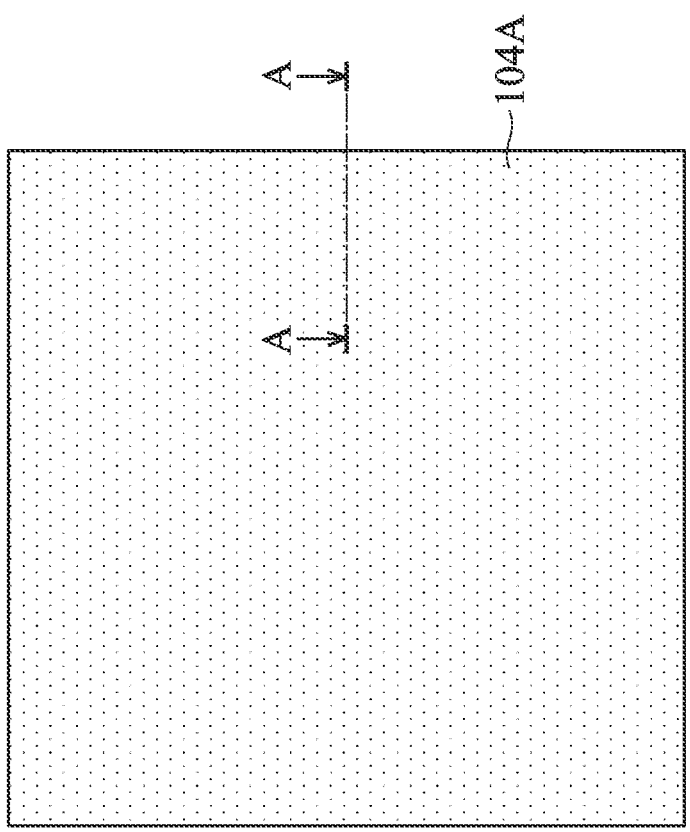
Figure 2A:
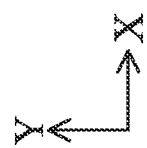
Figure 2B:
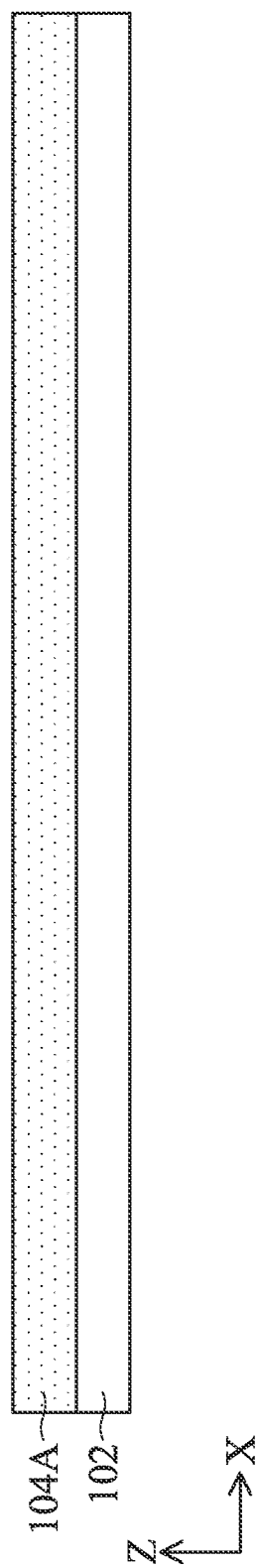

Next, as shown in FIG. 2A and FIG. 2B, a sub-collector layer 104A (a first doped semiconductor layer 104A) is formed on the substrate 102, according to some embodiments of the present disclosure. In some embodiments, the sub-collector layer 104A includes a III-V semiconductor having a first conductivity type. In some other embodiments, the sub-collector layer 104A includes a III-V semiconductor having a second conductivity type. In some embodiments, the second conductivity type is opposite to the first conductivity type. In some embodiments, the first conductivity type is n-type. The sub-collector layer 104A may include III-V semiconductors such as GaN, AlGaN, AlN, GaAs, AlGaAs, InP, InAlAs, InGaAs, or a combination thereof. In some embodiments, the sub-collector layer 104A is an n-type GaAs layer which may be doped by Si, Se, and Te. In some embodiments, the doping concentration of the sub-collector layer 104A is in a range of between 1e18 cm$^{-3}$ and 1e20 cm$^{-3}$. With doping concentration of this order, it may be easier to form an ohmic contact between the sub-collector layer 104A and subsequently formed collector electrode. If the doping concentration of the sub-collector layer 104A is too high, the dopant may not be activated completely and the reliability may be worse. If the doping concentration of the sub-collector layer 104A is too low, an ohmic contact may not be formed between the sub-collector layer 104A and subsequently formed collector electrode. In some embodiments, the sub-collector layer 104A may have a thickness of between 50 nm and 1500 nm. If the sub-collector layer 104A is too thick, it may be difficult for isolation by implantation. If the sub-collector layer 104A is too thin, the collector resistance may increase. In some embodiments, the sub-collector layer 104A is formed on the substrate 102 by molecular-beam epitaxy (MBE), metalorganic chemical vapor deposition (MOCVD), chemical vapor deposition (CVD), hydride vapor phase epitaxy (HYPE), another suitable method, or a combination thereof. The sub-collector layer 104A may be doped by in-situ doping.

Figure 3A:
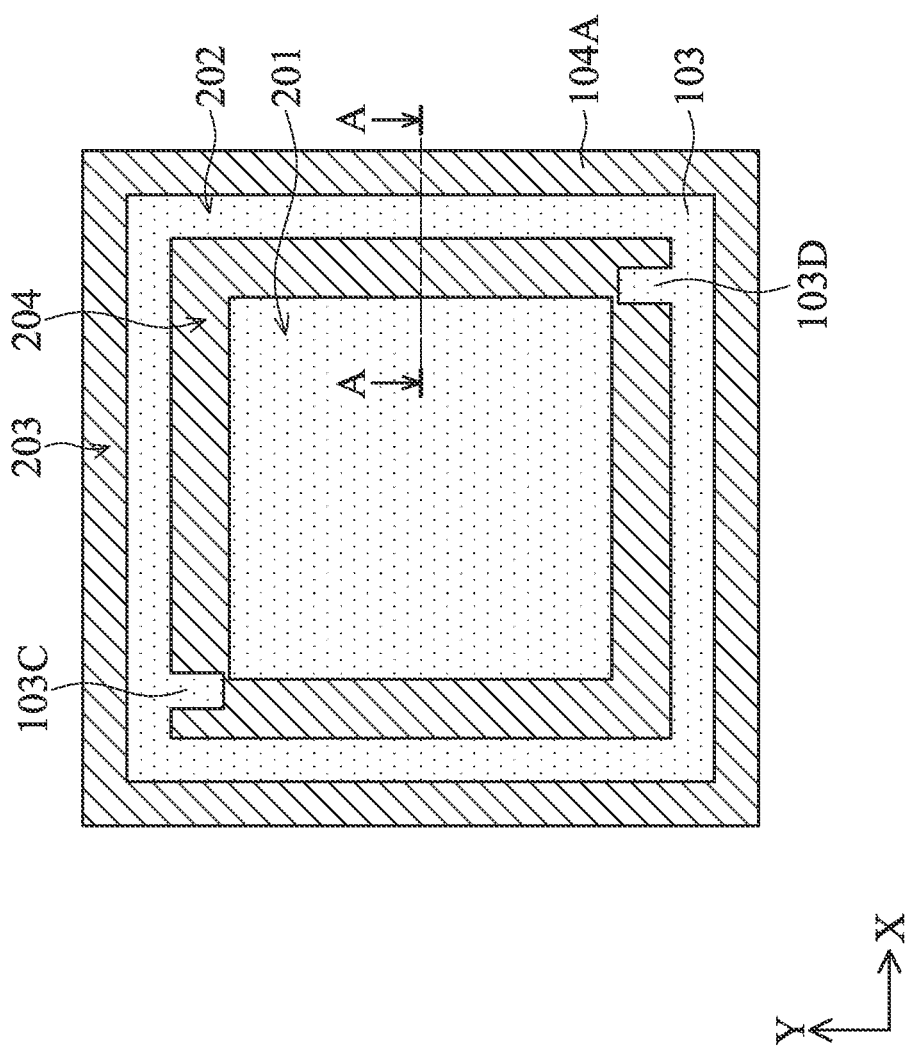
Figure 3B:
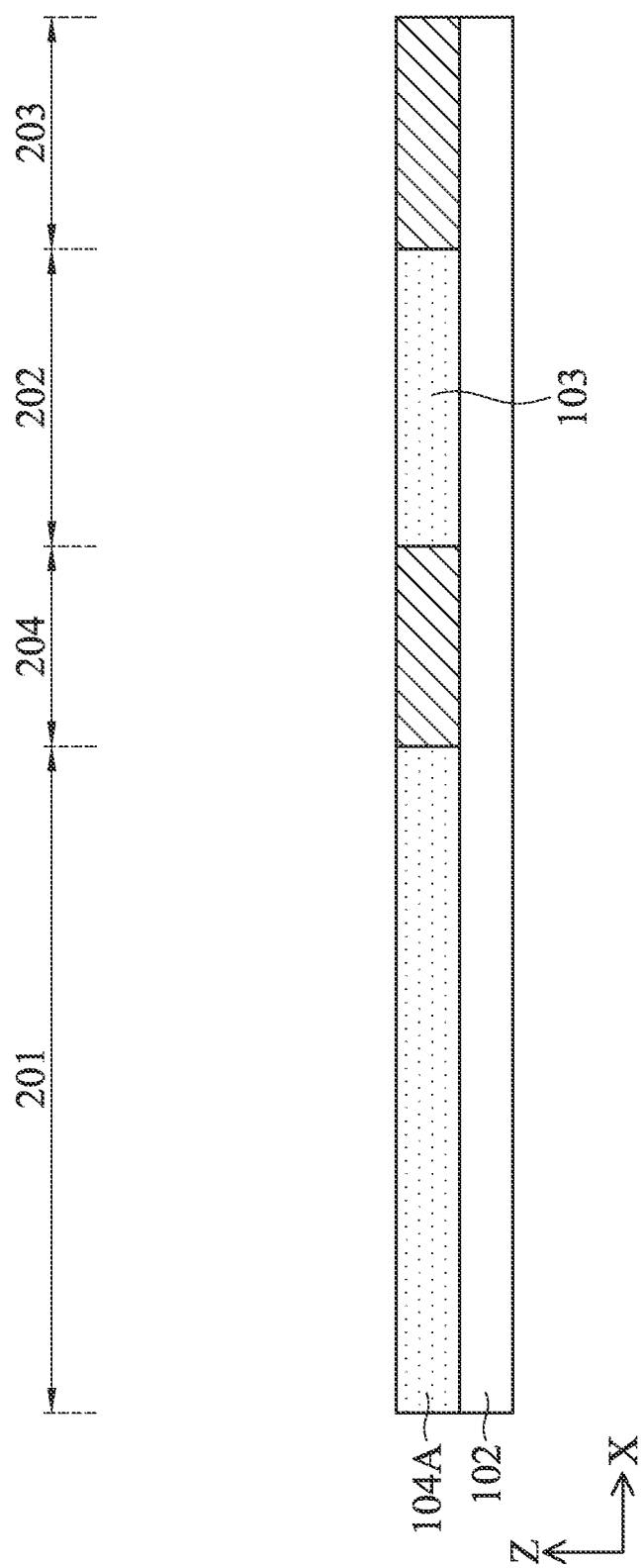

As shown in FIG. 3A and FIG. 3B, a ring element 103 is formed in the sub-collector layer 104A, according to some embodiments of the present disclosure. In some embodiments, the ring element 103 (or called as a collector mesa ring 103) is a conductive ring made of a doped semiconductor layer. In some embodiments, the ring element 103 includes a n-type doped semiconductor layer, a p-type doped semiconductor layer, or a combination thereof. In some embodiments, the doping concentration in the ring element 103 is between 1E18 cm$^{-3}$ and 4E19 cm$^{-3}$.

In some embodiments, an implantation process is performed on the sub-collector layer 104A to define the ring element 103 in the sub-collector layer 104A. In some embodiments, boron ions (or helium ions) are implanted into some regions of the n-type doped sub-collector layer 104A. For example, the implantation may be performed in some regions of an area 203 and an area 204 to define insulating regions in the sub-collector layer 104A. In some embodiments, an area 201 is surrounded by the area 204, an area 202 is between the area 203 and the area 204, and no implantation is performed in the area 201 and the area 202. In some embodiments, at least one region of the sub-collector layer 104A that is not implanted with boron ions can serve as the ring element 103, such as the sub-collector layer 104A in the area 202. In some embodiments, another implantation process may be performed to adjust the conductivity of the ring element 103. In some embodiments, the ring element 103 may be referred to as a collector mesa ring (CMESA ring). Therefore, the ring element 103 may have a different electrical conductivity than other portions of the sub-collector layer 104A. For example, it may have better electrical conductivity than other portions of the sub-collector layer 104A in the area 203 or the area 204. Therefore, the ring element 103 may act as a conductive region and can be used to detect the die crack.

In some embodiments, as shown in FIG. 3A, the ring element 103 includes protruding portions 103C and 103D. In some embodiments, the protruding portion 103C is connected to a first pad (such as the conductive pad 205A shown in FIG. 4A), and the protruding portion 103D is connected to a second pad (such as the conductive pad 205B shown in FIG. 4A) through conductive features (such as vias and/or conductive layers) formed in subsequent processes.

In some embodiments, active devices and/or passive devices are formed in the area 201. Therefore, the area 201 may serve as a device area. The active device may include a heterojunction bipolar transistor (HBT), a high electron mobility transistor (HEMT), other applicable semiconductor devices, or a combination thereof. The passive device may include a capacitor, a resistor, an inductor, a filter, a PIN diode, other applicable device, or a combination thereof.

In some embodiments, the sub-collector layer 104A in the area 201 may serve as a sub-collector layer of an HBT in the device area 201. In some embodiments, the area 202 may be surrounded by the area 203 and formed between the area 203 and the area 204.

Figure 4A:
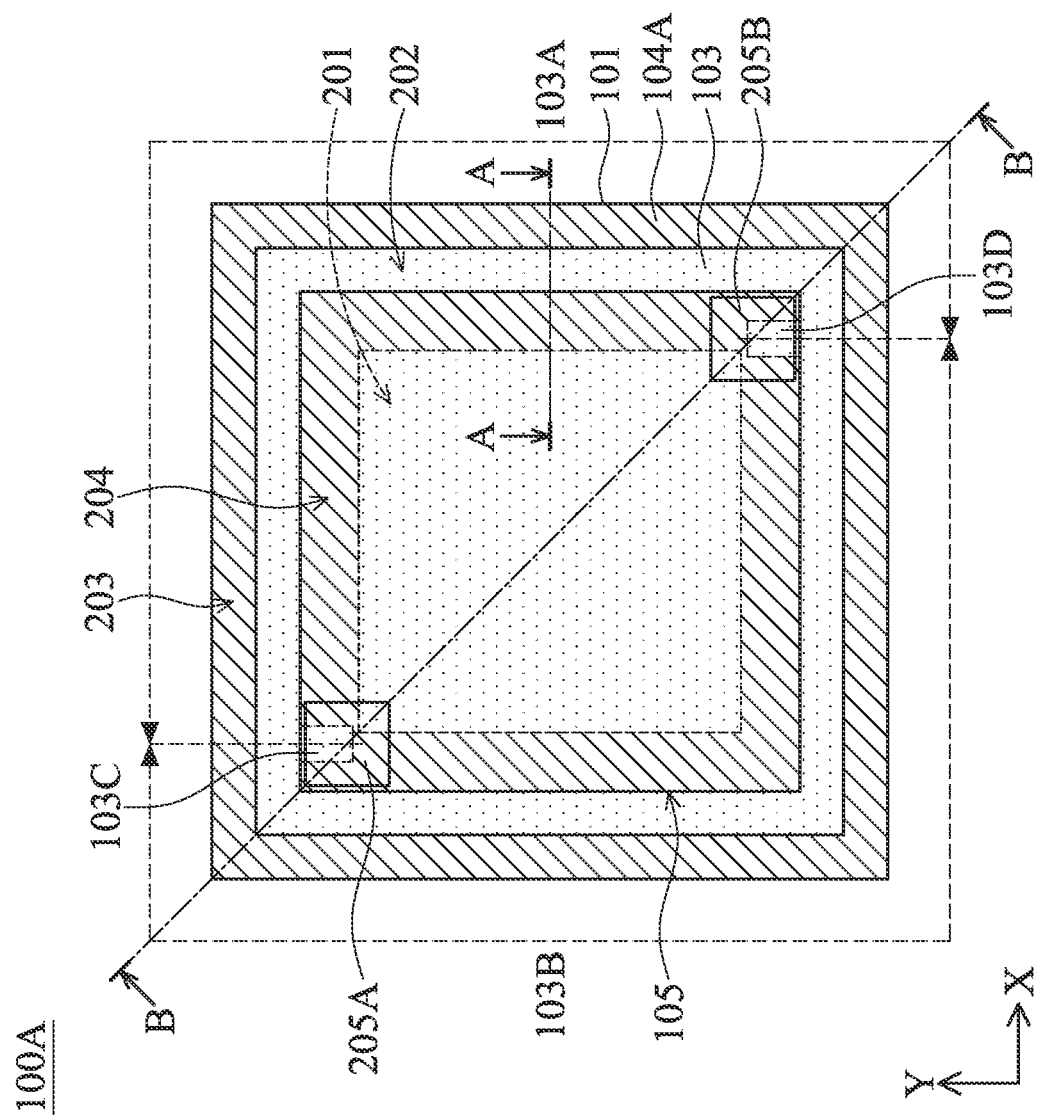
Figure 4B:
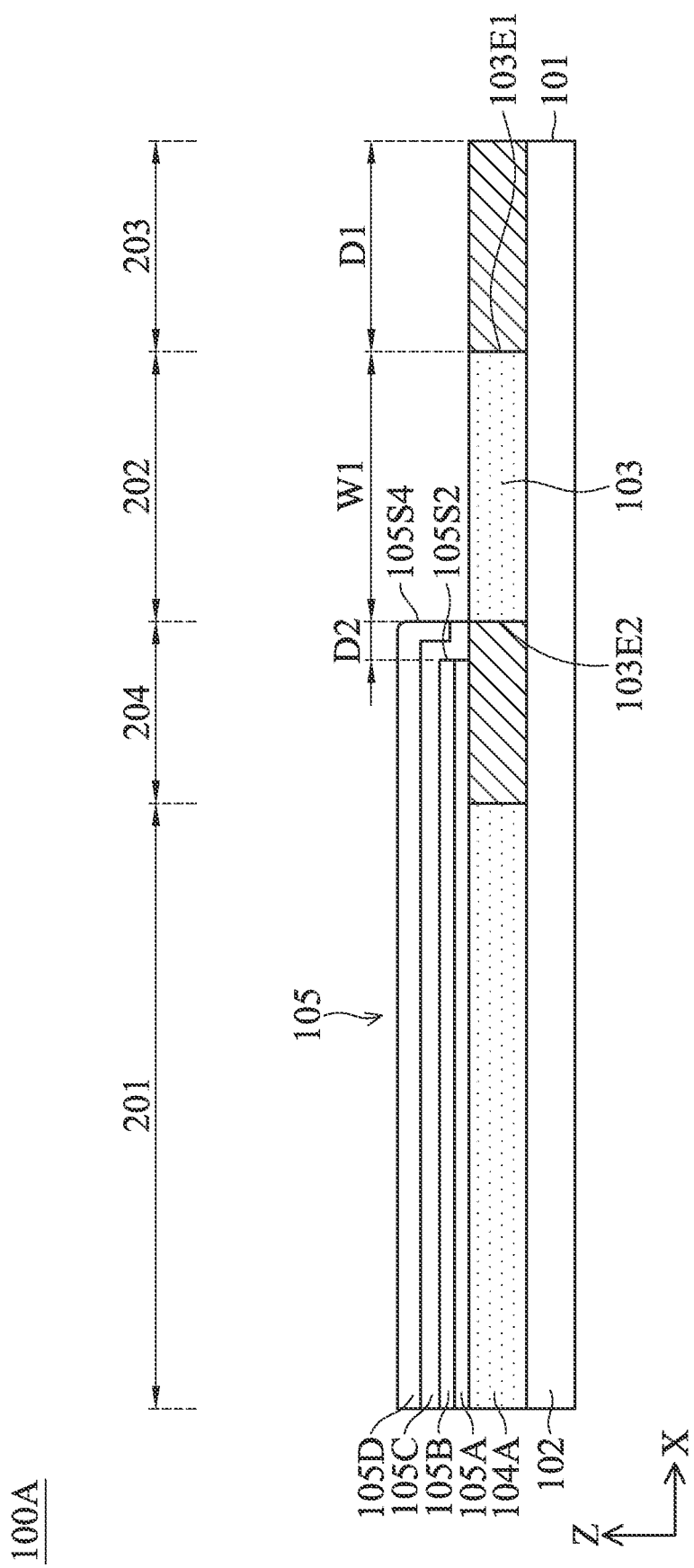

Next, as shown in FIG. 4A and FIG. 4B, a protective structure 105 (or protective layer) is disposed on the sub-collector layer 104A and in the area 201, in accordance with some embodiments of the present disclosure. In some embodiments, the protective structure 105 may be used for protecting the elements in the area 201. Afterwards, a conductive pad 205A and a conductive pad 205B are formed on the protective structure 105 and in the area 201 to form the semiconductor structure 100A, in accordance with some embodiments of the present disclosure. In some embodiments, the conductive pad 205A is electrically connected to the ring element 103 by a first conductive feature formed between the ring element 103 and the conductive pad 205A, and the conductive pad 205B is electrically connected to the ring element 103 by a second conductive feature formed between the ring element 103 and the conductive pad 205B.

In some embodiments, the conductive features include vias in the protective structure 105. In some embodiments, the vias are in direct contact with the ring element 103 and the conductive pad 205A and the conductive pad 205B. In some embodiments, conductive layers are further provided in the protective structure 105, and the conductive pad 205A and the conductive pad 205B are electrically connected to the ring element 103 by the vias and the conductive layers.

Figure 4C:
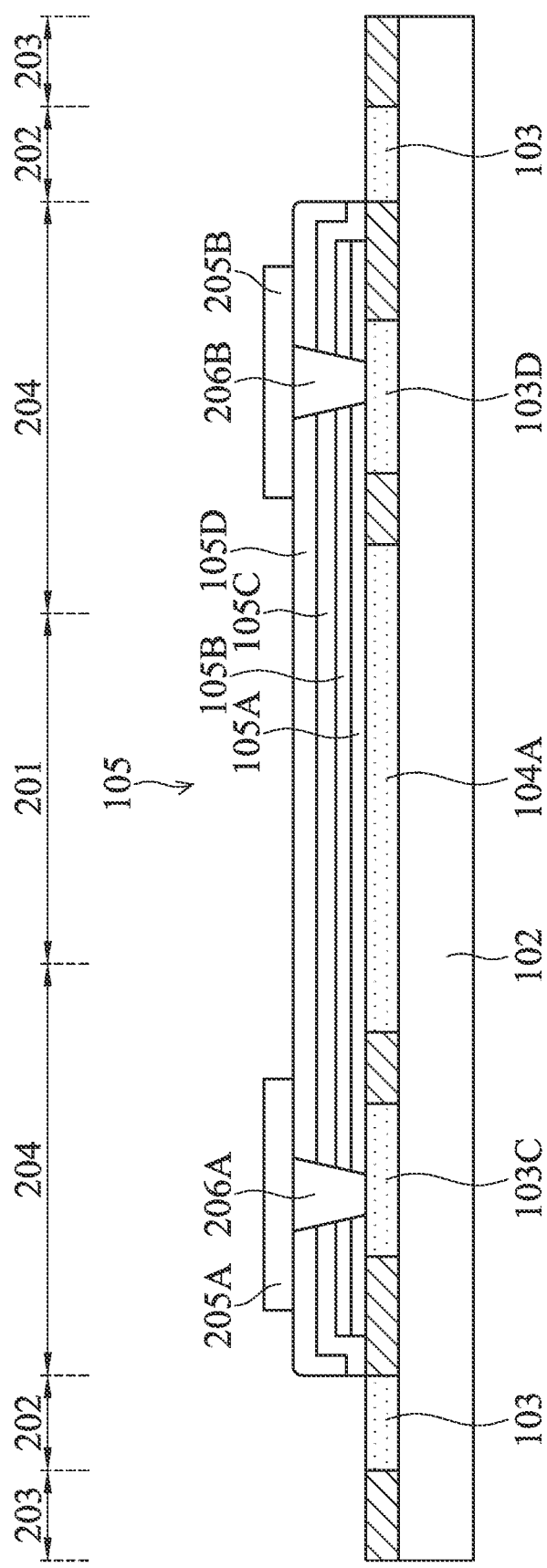
FIG. 4C is a cross-sectional view taken along line B-B of FIG. 4A, in accordance with some embodiments of the present disclosure.

FIG. 4C is a cross-sectional view taken along line B-B of FIG. 4A, in accordance with some embodiments of the present disclosure. In some embodiments, as shown in FIG. 4C, the conductive pad 205A is electrically connected to the protruding portion 103C through a first conductive feature (e.g., via) 206A. In some embodiments, the conductive pad 205B is electrically connected to the protruding portion 103D through a second conductive feature (e.g., via) 206B. In some embodiments, the first conductive feature 206A and the second conductive feature 206B are right under the conductive pad 205A and the conductive pad 205B, respectively. In some embodiments, the first conductive feature 206A and the second conductive feature 206B are right above the protruding portions 103C and 103D, respectively. In some embodiments, the first conductive feature 206A and the second 206B are disposed in the protective structure 105, such as by a lithography process (e.g., coating the resist, soft baking, exposure, post-exposure baking, developing, other applicable processes, or a combination thereof), an etching process (e.g., wet etching process, dry etching process, other applicable processes, or a combination thereof), other applicable processes, or a combination thereof. In some embodiments, the first conductive feature 206A and the second conductive feature 206B include a combination of vias and conductive layers.

Figure 4D:
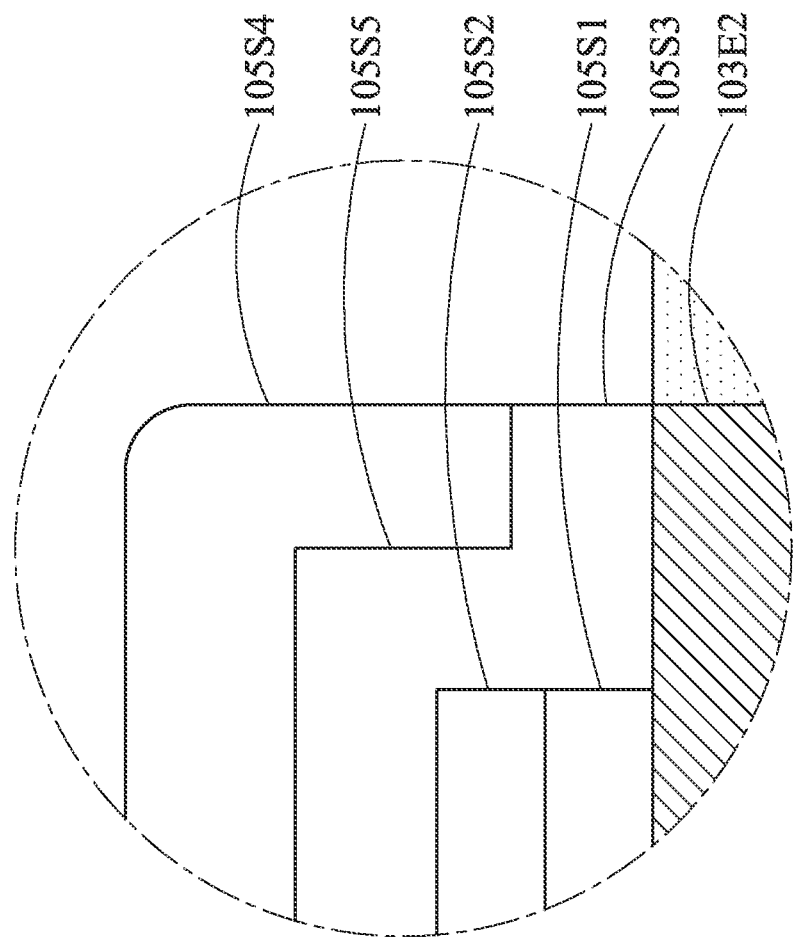
FIG. 4D is an enlarged view showing the details of the protective structure, in accordance with some embodiments of the present disclosure.

FIG. 4D is an enlarged view showing the details of the protective structure 105, in accordance with some embodiments of the present disclosure. In some embodiments, the protective structure 105 may include a first dielectric layer 105A, a second dielectric layer 105B, a third dielectric layer 105C, and a fourth dielectric layer 105D. In some embodiments, the first dielectric layer 105A is disposed on the sub-collector layer 104A, the second dielectric layer 105B is disposed on the first dielectric layer 105A, and the third dielectric layer 105C is disposed on the second dielectric layer 105B and covering a sidewall 105S1 of the first dielectric layer 105A and a sidewall 105S2 of the second dielectric layer 105B. In some embodiments, the third dielectric layer 105C is in contact with the sub-collector layer 104A. In some embodiments, the fourth dielectric layer 105D is disposed on the third dielectric layer 105C, and a stepped interface 105S5 is formed between the third dielectric layer 105C and the fourth dielectric layer 105D. In some embodiments, vias and conductive layers (not shown) may be provided between the first dielectric layer 105A, the second dielectric layer 105B, the third dielectric layer 105C, and/or the fourth dielectric layer 105D to provide electrical connection between the ring element 103 and the conductive pad 205A and the conductive pad 205B.

In some embodiments, the protective structure 105 may include $SiN_x$ (x may be between 1 and 3, and specifically SiN, $Si_3N_4$, $Si_2N_3$ or a combination thereof), $SiO_2$, SiON, $Al_2O_3$, AlN, polyimide (PI), benzocyclobutene (BCB), or polybenzoxazole (PBO), other insulating materials, or a combination thereof. For example, the first dielectric layer 105A, the second dielectric layer 105B, the third dielectric layer 105C may include SiN, and the fourth dielectric layer 105D may include PBO. The protective structure 105 may be formed by metalorganic chemical vapor deposition (MOCVD), chemical vapor deposition (CVD), spin-coating, another suitable method, or a combination thereof.

In some embodiments, the ring element 103 may be separated as a first portion 103A and a second portion 103B between the conductive pad 205A and the conductive pad 205B. In some embodiments, the first portion 103A and the second portion 103B are electrically connected to the conductive pad 205A and the conductive pad 205B in parallel. In some embodiments, the first portion 103A has an electrical resistance R1, and the second portion 103B has an electrical resistance R2. In some embodiments, the lengths of the first portion 103A and the second portion 103B may be substantially identical, but the present disclosure is not limited thereto. In some embodiments, the conductive pad 205A and the conductive pad 205B may be positioned at diagonal angles of the area 201 of the semiconductor structure 100A, so the lengths of the first portion 103A and the second portion 103B as well as the electrical resistances R1 and R2 may be substantially identical, but the present disclosure is not limited thereto.

In some embodiments, a total electrical resistance RT1 between the conductive pad 205A and the conductive pad 205B may be calculated by the following equation:

$$\frac{1}{RT1} = \frac{1}{R1} + \frac{1}{R2}$$

If any crack form at the edge of the semiconductor structure 100A, when the crack propagates to the ring element 103, such as propagates to the second portion 103B, the second portion 103B will be no longer conductive, so that the total electrical resistance RT2 between the conductive pad 205A and the conductive pad 205B at this moment may be presented as:

RT2=R1

Even if the crack does not propagate through the entire ring element 103, the total electrical resistance will still be affected since the electrical resistance of the first portion 103A or the second portion 103B will be changed by the crack. Therefore, whether any crack exists may be determined by measuring the electrical resistance between the conductive pad 205A and the conductive pad 205B.

In some embodiments, the ring element 103 (or the area 202) has a width of W1. In some embodiments, the width W1 is between 2 μm and 10 μm (e.g., 5 μm). In some embodiments, the distance D1 between the edge 101 of the semiconductor structure 100A and the edge 103E1 of the ring element 103 is between 5 μm and 20 μm (e.g., 10 μm). In some embodiments, the ratio of W1 to D1 is between 0.1 and 2. The width W1 and the distance D1 may be adjusted to improve the die's crack detection sensitivity.

In some embodiments, the edge 105S1 of the first dielectric layer 105A is aligned with the edge 105S2 of the second dielectric layer 105B. In some embodiments, the edge 105S3 of the third dielectric layer 105C is aligned with the edge 105S4 of the fourth dielectric layer 105D. In some embodiments, the distance D2 between edge 105S4 and edge 105S2 is between 0.5 μm and 1.5 μm (e.g., 1 μm). In some embodiments, edge 105S1 may be aligned with the edge 103E2 of the ring element 103. In some embodiments, the width D2 of the stepped interface between the third dielectric layer 105C and the fourth dielectric layer 105D may be less than the width W1 of the area 202.

Figure 5:
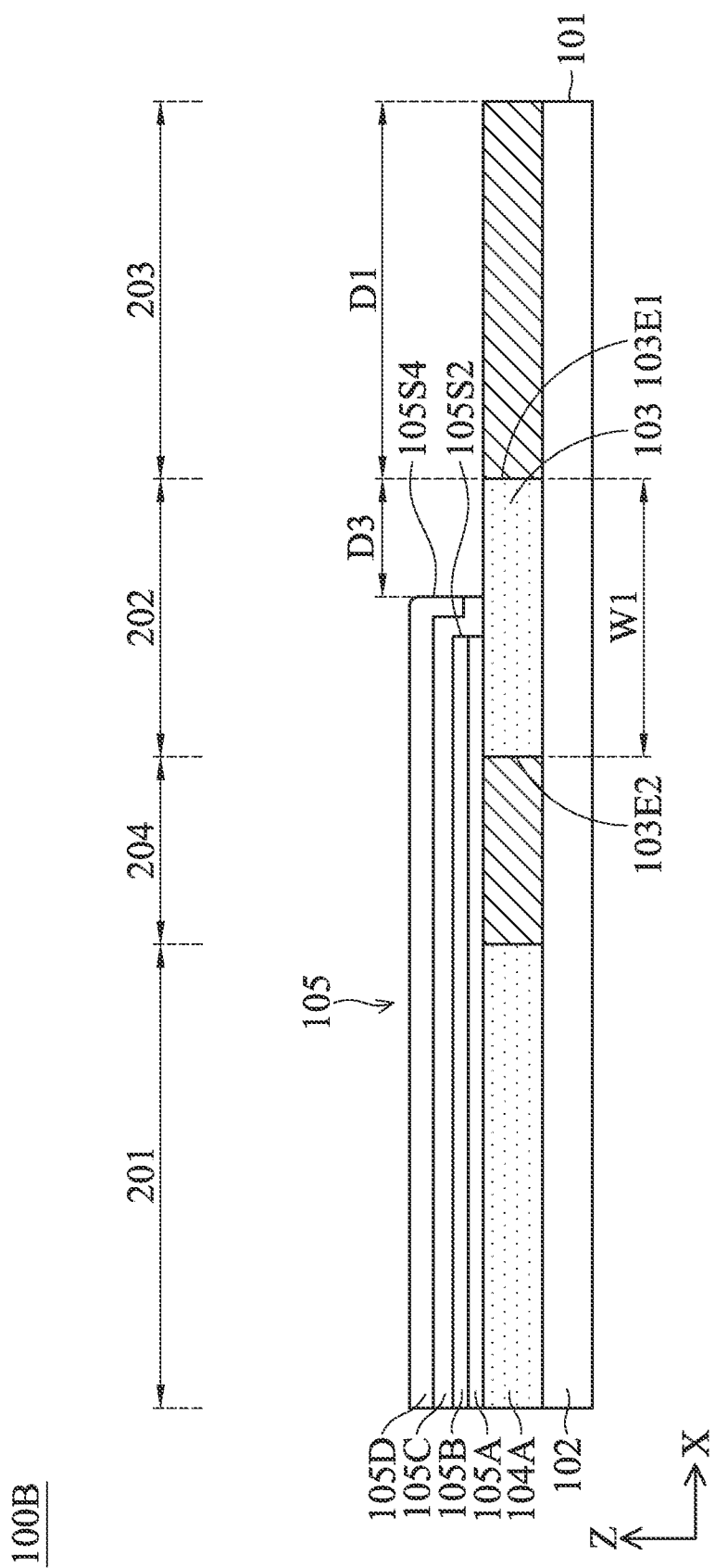
FIG. 5 shows a semiconductor structure in some embodiments of the present disclosure, in accordance with some embodiments of the present disclosure.

FIG. 5 shows a semiconductor structure 100B in some embodiments of the present disclosure. As shown in FIG. 5, the position of the ring element 103 may be adjusted, such as being partially covered by the protective structure 105. For example, a portion of the ring element 103 is under and covered by the protective structure 105, and another portion of the ring element 103 is exposed from the protective structure, so as to prevent the ring element 103 from damage during the manufacturing processes (e.g., an etching process).

In some embodiments, the width W1 is between 2 μm and 10 μm (e.g., 5 μm). In some embodiments, the distance D1 between the edge 101 of the semiconductor structure 100A and the edge 103E1 of the ring element 103 is between 5 μm and 20 μm (e.g., 10 μm). In some embodiments, the ratio of W1 to D1 may be between 0.1 and 2. The width W1 and the distance D1 may be adjusted to improve the die's crack detection sensitivity. In some embodiments, the distance D2 between edge 105S4 and edge 105S2 is between 0.5 μm and 1.5 μm (e.g., 1 μm). In some embodiments, the distance D3 between edge 105S4 and edge 103E1 is between 1 μm and 9 μm (e.g., 4 μm). In some embodiments, the ratio of W1 to D3 is between 1 and 10. The width W1 and the distance D3 may be adjusted to improve the reliability of the die.

Figure 6:
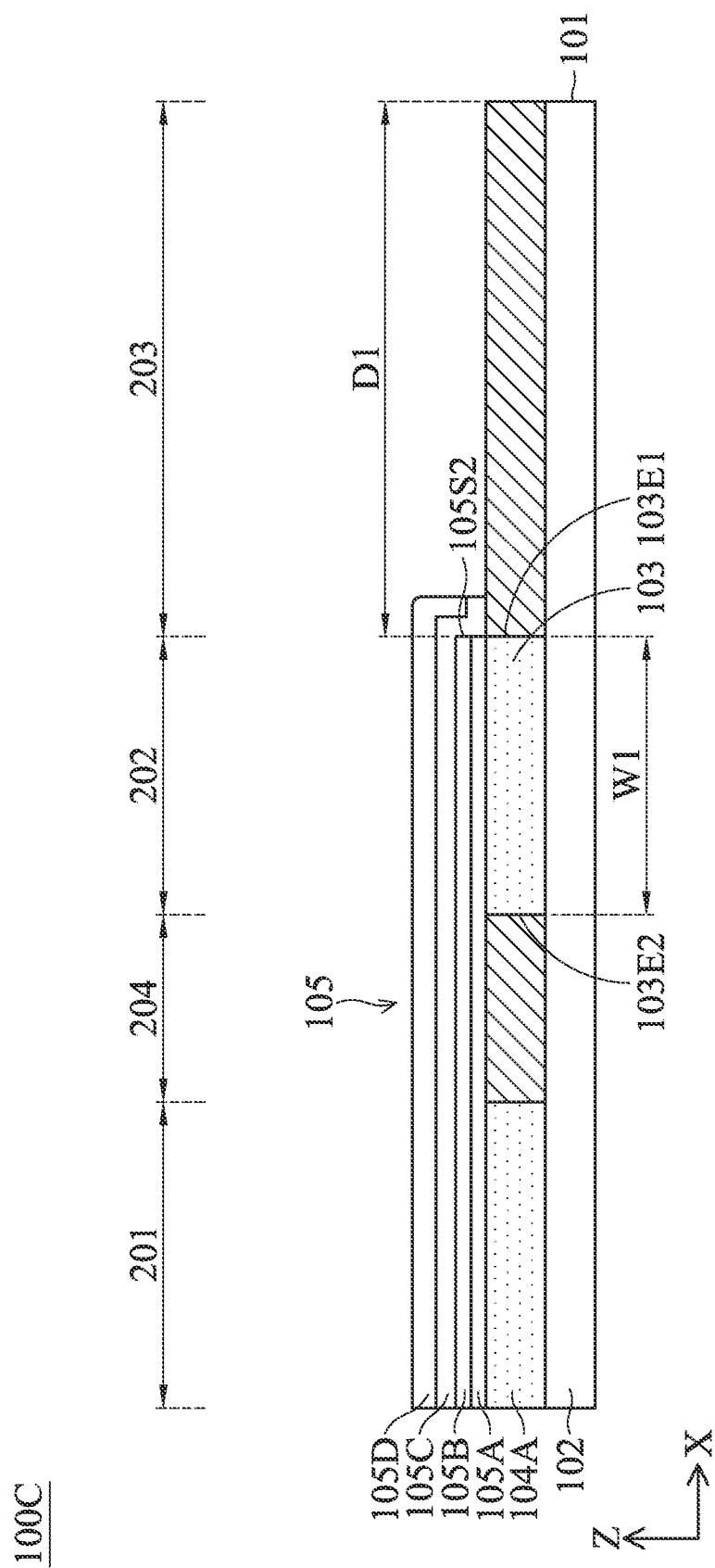
FIG. 6 shows a semiconductor structure in some embodiments of the present disclosure, in accordance with some embodiments of the present disclosure.

FIG. 6 shows a semiconductor structure 100C in some embodiments of the present disclosure. As shown in FIG. 6, the position of the ring element 103 may be further adjusted, such as being fully covered by the protective structure 105. Therefore, the ring element 103 may be prevented from damage during the manufacturing processes (e.g., an etching process). In some embodiments, the edge 103E1 may be aligned with the edge 105S2 facing the ring element 103, but the present disclosure is not limited thereto. In some embodiments, the width W1 is between 2 μm and 10 μm (e.g., 5 μm). In some embodiments, the distance D1 between the edge 101 of the semiconductor structure 100A and the edge 103E1 of the ring element 103 is between 5 μm and 30 μm (e.g., 15 μm). In some embodiments, the ratio of W1 to D1 may be between 1/15 and 2.

Figure 7A:
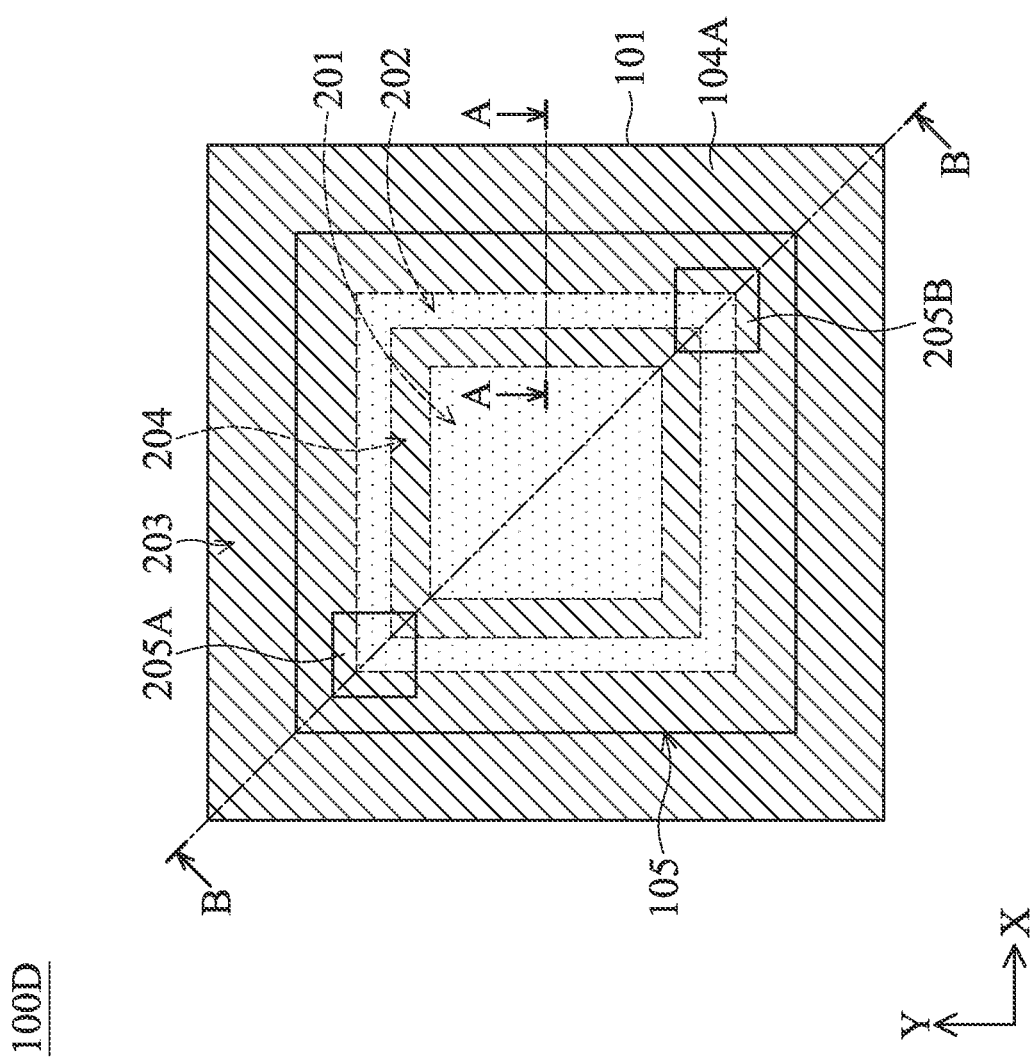
FIG. 7A shows a top view of a semiconductor structure in some embodiments of the present disclosure.
Figure 7B:
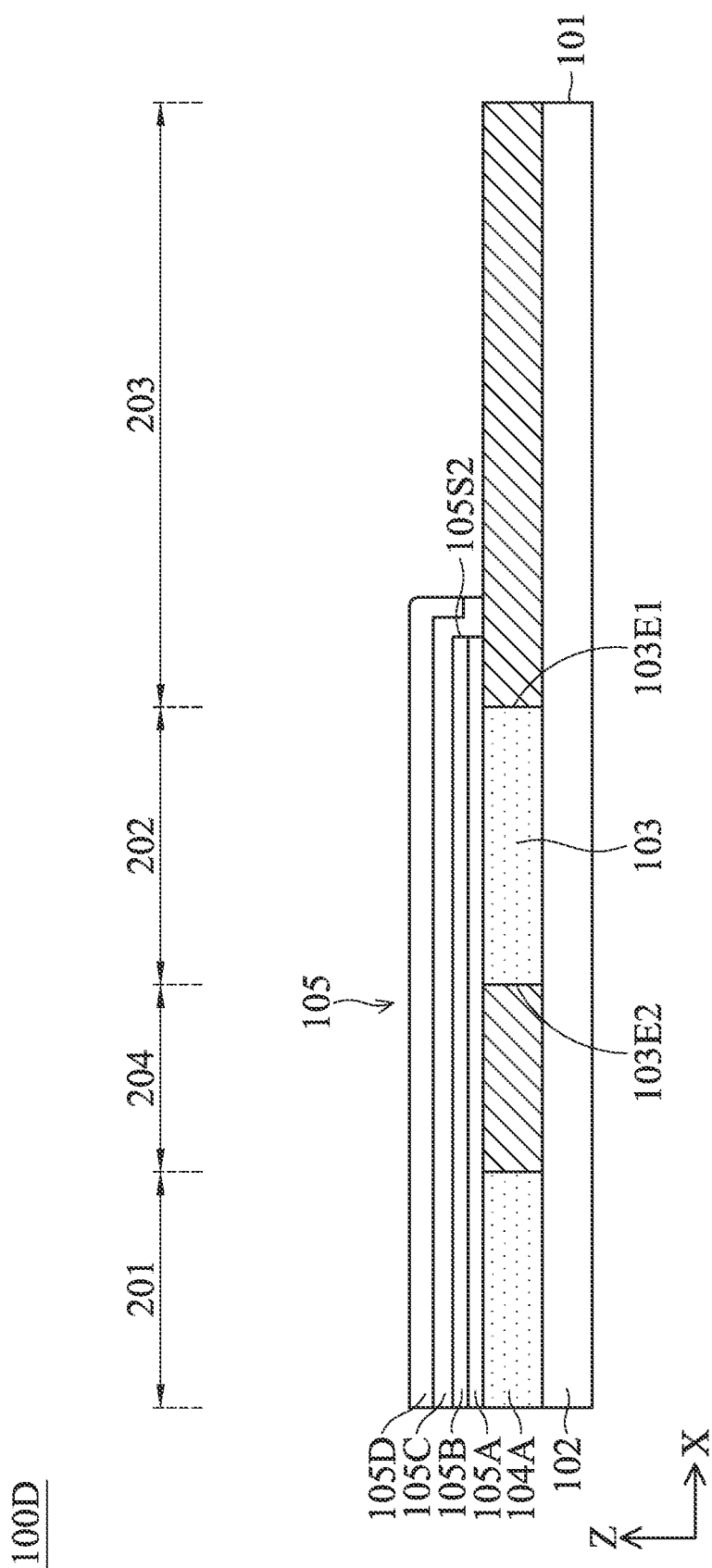
FIG. 7B is a cross-sectional view illustrated along the line A-A in FIG. 7A, in accordance with some embodiments of the present disclosure.
Figure 7C:
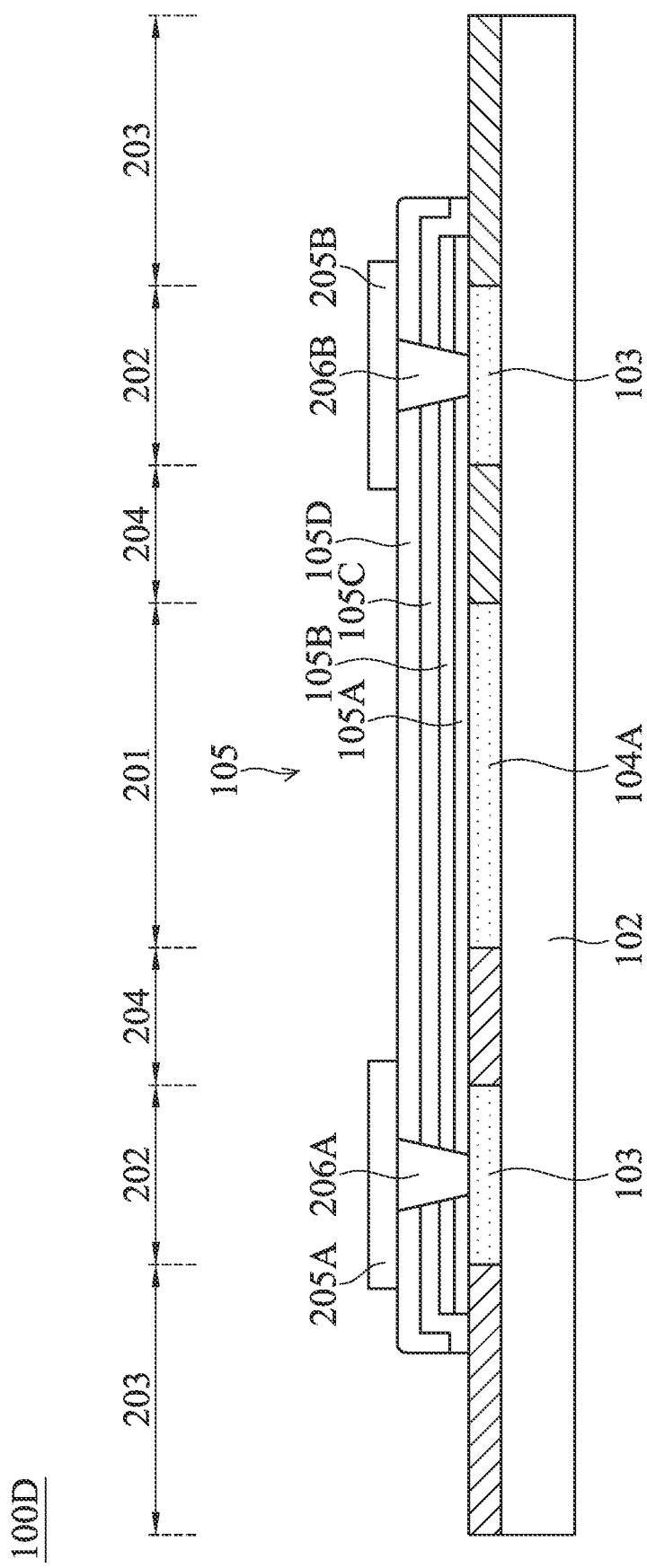
FIG. 7C is a cross-sectional view illustrated along the line B-B in FIG. 7A, in accordance with some embodiments of the present disclosure.

FIG. 7A is a top view of a semiconductor structure 100D in some embodiments of the present disclosure. FIG. 7B is a cross-sectional view illustrated along the line A-A in FIG. 7A, in accordance with some embodiments of the present disclosure. FIG. 7C is a cross-sectional view illustrated along the line B-B in FIG. 7A, in accordance with some embodiments of the present disclosure. As shown in FIG. 7A, FIG. 7B, and FIG. 7C, the position of the ring element 103 may be further adjusted, such as being fully covered by the protective structure 105, and the edge 103E1 may be spaced apart from the edge 105S2. Therefore, the ring element 103 may be further prevented from damage during the manufacturing processes (e.g., an etching process). In some embodiments, the conductive pad 205A and the conductive pad 205B are electrically connected to the ring element 103 through a first conductive feature (e.g., via) 206A and a second conductive feature (e.g., via) 206B, respectively. In some embodiments, the first conductive feature 206A and the second conductive feature 206B are right under the conductive pad 205A and the conductive pad 205B, respectively. In some embodiments, the first conductive feature 206A and the second conductive feature 206B are right above the ring element 103. In some embodiments, the first conductive feature 206A and the second conductive feature 206B are formed in the protective structure 105 by a lithography process, an etching process, other applicable processes, or a combination thereof.

Figure 8:
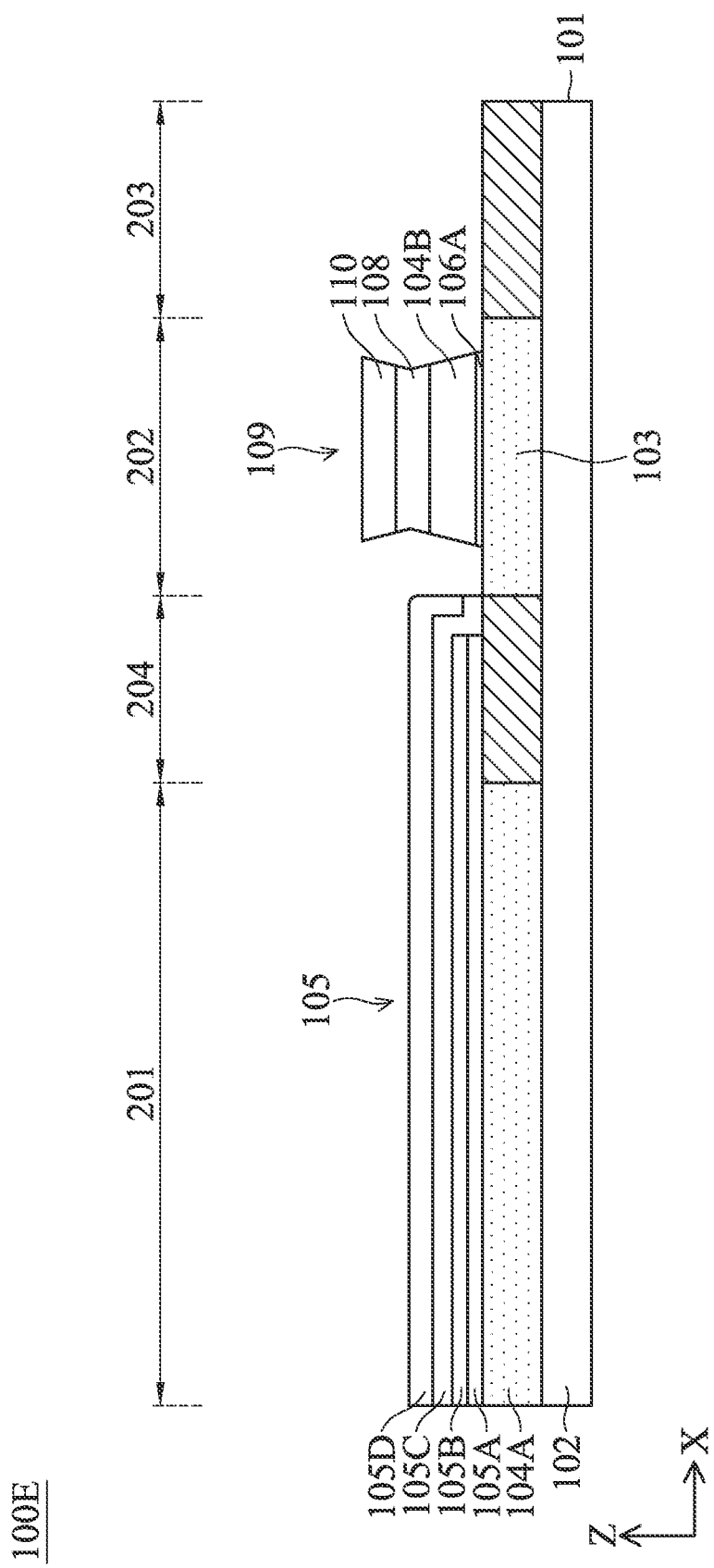
FIG. 8 shows a semiconductor structure in some embodiments of the present disclosure.

FIG. 8 shows a semiconductor structure 100E in some embodiments of the present disclosure. As shown in FIG. 8, a base mesa ring 109 is provided on the ring element 103, in accordance with some embodiments of the present disclosure. In some embodiments, the base mesa ring 109 may include an etch stop layer 106A, a sub-collector layer 104B, a collector layer 108, and a base layer 110. By providing the base mesa ring 109 on the ring element 103, the ring element 103 may be protected, and the crack detection sensitivity may be further enhanced.

In some embodiments, the etch stop layer 106A includes InGaP, InGaAs, GaAsP, AlGaAs, InAlAs, GaSb or a combination thereof. In some embodiments, the etch stop layer 106A has a doping concentration in the same order with the doping concentration of the sub-collector layer 104A. In these embodiments, the doping concentration of the etch stop layer 106A is in a range of between 1e18 cm$^{-3}$ to 1e20 cm$^{-3}$. If the doping concentration of the etch stop layer 106A is too high, the dopant may not be activated completely and the reliability may be worse. If the doping concentration of the etch stop layer 106A is too low, the collector resistance may increase. In some embodiments, the etch stop layer 106A may have a thickness of between 5 nm and 200 nm. If the etch stop layer 106A is too thick, the collector resistance may increase. If the etch stop layer 106A is too thin, it may not be sufficient to make subsequent etching process stop. The etch stop layer 106A may be formed by molecular-beam epitaxy (MBE), metalorganic chemical vapor deposition (MOCVD), chemical vapor deposition (CVD), hydride vapor phase epitaxy (HYPE), another suitable method, or a combination thereof. The etch stop layer 106A may be doped by in-situ doping.

In some embodiments, the sub-collector layer 104A may be referred to as a lower sub-collector layer 104A, and the sub-collector layer 104B may be referred to as a upper sub-collector layer 104B. In some embodiments, the sub-collector layer 104B has a thickness of between 50 nm and 1500 nm. In some embodiments, the thickness of the sub-collector layer 104B and the thickness of the bottom sub-collector layer 104A are substantially the same. In some embodiments, the doping concentration of the sub-collector layer 104B is in a range of between 1e18 cm$^{-3}$ to 1e20 cm$^{-3}$. Materials and processes used to form the sub-collector layer 104B may be similar to, or the same as, those used to form the sub-collector layer 104A described previously and are not repeated herein for brevity.

In some embodiments, the collector layer 108 includes a III-V semiconductor having a first conductivity type. The collector layer 108 may include III-V semiconductors such as GaN, AlGaN, AlN, GaAs, AlGaAs, InP, InAlAs, InGaAs, GaSb, or a combination thereof. In some embodiments, the collector layer 108 is an n-type GaAs layer. The collector layer 108 may be formed by molecular-beam epitaxy (MBE), metalorganic chemical vapor deposition (MOCVD), chemical vapor deposition (CVD), hydride vapor phase epitaxy (HYPE), another suitable method, or a combination thereof. In some embodiments, the doping concentration of the collector layer 108 is more than 0 cm$^{-3}$, and equal to or less than 1e18 cm$^{-3}$. The collector layer 108 may be a multi-layer structure with different doping concentration.

In some embodiments, the base layer 110 includes a III-V semiconductor having a second conductivity type. The base layer 110 may include III-V semiconductors such as GaN, AlGaN, AlN, GaAs, AlGaAs, InP, InAlAs, InGaAs, GaSb or a combination thereof. In some embodiments, the base layer 110 is a highly doped p-type GaAs layer which may be doped by C, Mg, Zn, Ca, Be, Sr, Ba, and Ra. The doping concentration of the base layer 110 may be in a range of between 1e18 cm$^{-3}$ to 1e20 cm$^{-3}$. The base layer 110 may be formed by molecular-beam epitaxy (MBE), metalorganic chemical vapor deposition (MOCVD), chemical vapor deposition (CVD), hydride vapor phase epitaxy (HYPE), another suitable method, or a combination thereof.

Figure 9:
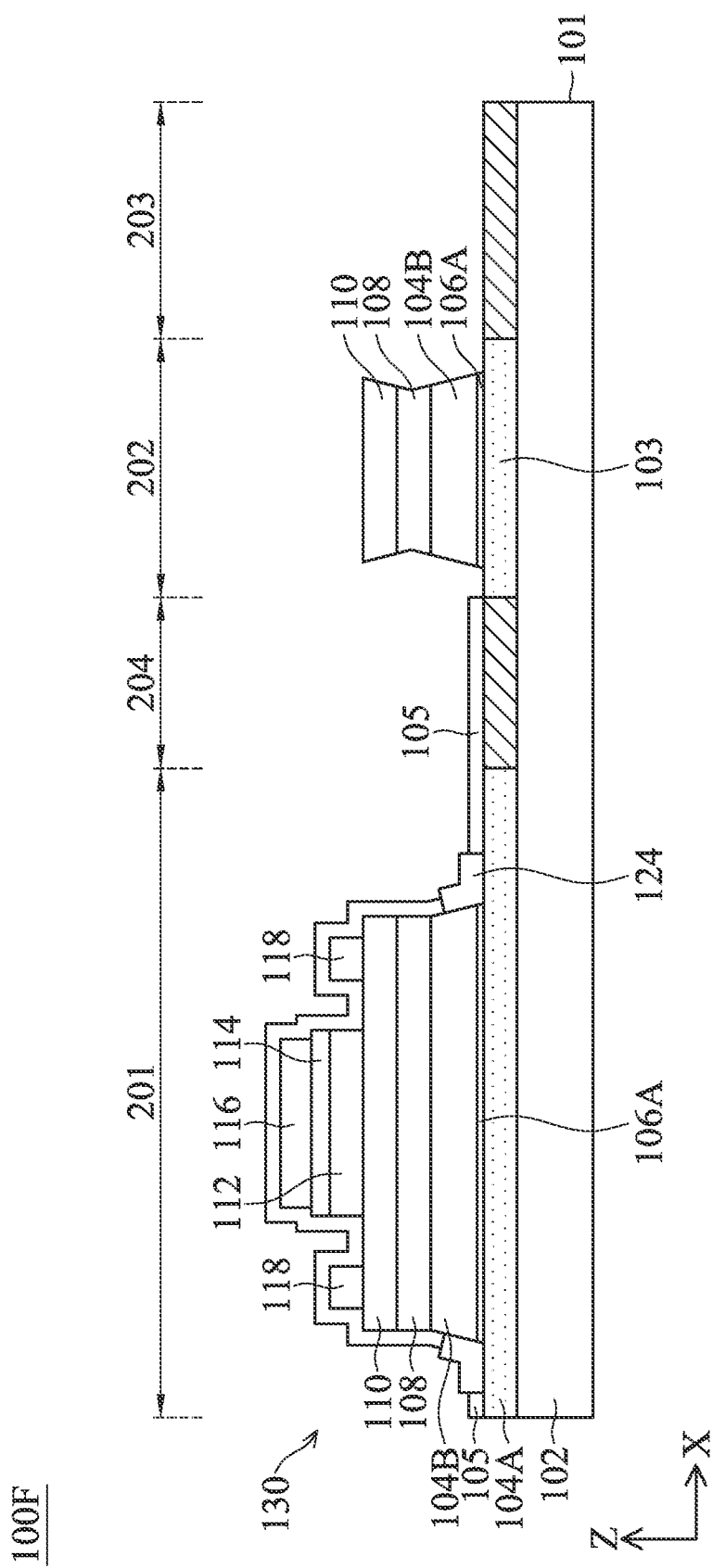
FIG. 9 shows a semiconductor structure in some embodiments of the present disclosure.

In some embodiments, active devices (e.g. heterojunction bipolar transistor (HBT), high electron mobility transistor (HEMT), or a combination thereof) may be provided in the area 201. For example, FIG. 9 shows a semiconductor structure 100F in some embodiments of the present disclosure. As shown in FIG. 9, a heterojunction bipolar transistor 130 is formed in the area 201, in accordance with some embodiments of the present disclosure. It should be noted that the protective structure 105 is shown as a single layer in FIG. 9 for simplicity, in accordance with some embodiments of the present disclosure. In some embodiments, the etch stop layer 106A, the sub-collector layer 104B, the collector layer 108, and the base layer 110 may be formed in the base mesa ring 109 and the heterojunction bipolar transistor 130 at the same time. A detailed description of the materials and the process of these elements is not repeated herein.

In some embodiments, the heterojunction bipolar transistor 130 further includes an emitter layer 112 formed on the base layer 110. In some embodiments, the emitter layer 112 includes a III-V semiconductor having a first conductivity type. The emitter layer 112 may include III-V semiconductors such as GaN, AlGaN, AlN, GaAs, AlGaAs, InP, InAlAs, InGaAs, or a combination thereof. In some embodiments, the emitter layer 112 is an n-type InGaP layer. The emitter layer 112 may be a multi-layer structure. In some embodiments, the emitter layer 112 includes an n-type InGaP layer at the bottom and an n-type GaAs layer at the top (not shown.) In some embodiments, the material of the emitter layer 112 and the material of the base layer 110 are different materials with different band gaps. Therefore, a heterojunction may be formed at the interface between the emitter layer 112 and the base layer 110. The emitter layer 112 may be formed by molecular-beam epitaxy (MBE), metalorganic chemical vapor deposition (MOCVD), chemical vapor deposition (CVD), hydride vapor phase epitaxy (HYPE), another suitable method, or a combination thereof.

In some embodiments, the heterojunction bipolar transistor 130 may further include an emitter cap layer 114 formed on the emitter layer 112. In some embodiments, the emitter cap layer 114 includes a III-V semiconductor having a first conductivity type. The emitter cap layer 114 may include III-V semiconductors such as GaN, AlGaN, AlN, GaAs, AlGaAs, InP, InAlAs, InGaAs, or a combination thereof. In some embodiments, the emitter cap layer 114 is a highly doped n-type InGaAs layer which may help to form ohmic contact between the emitter cap layer 114 and the subsequently formed emitter electrode. The emitter cap layer 114 may be formed by molecular-beam epitaxy (MBE), metalorganic chemical vapor deposition (MOCVD), chemical vapor deposition (CVD), hydride vapor phase epitaxy (HYPE), another suitable method, or a combination thereof.

In some embodiments, the heterojunction bipolar transistor 130 may further include an emitter electrode 116 formed on the emitter cap layer 114. The emitter electrode 116 may include Ti, Al, Au, Pd, Pt, Cu, W, other suitable metal, its alloy, or a combination thereof. An emitter electrode material may be formed on the emitter cap layer 114 first by electroplating, sputtering, resistive heating evaporation, physical vapor deposition (PVD), chemical vapor deposition (CVD), atomic layer deposition (ALD), another suitable method, or a combination thereof. In some embodiments, the electrode material is then patterned by a photolithography and an etching process, and the emitter electrode 116 is formed.

In some embodiments, the heterojunction bipolar transistor 130 may further include a base electrode 118 formed on the base layer 110. In some embodiments, the processes and materials for forming the base electrode 118 may be the same as, or similar to, those used to form the emitter electrode 116. For the purpose of brevity, the descriptions of these processes and materials are not repeated herein.

In some embodiments, the heterojunction bipolar transistor 130 may further include collector electrodes 124 formed on and electrically connected to the sub-collector layer 104B. The collector electrodes 124 may include conductive material such as Ti, Al, Au, Pd, Pt, Cu, W, other suitable metal, its alloy, or a combination thereof. The processes for forming the collector electrodes 124 may be the same as, or similar to, those used to form the emitter electrode 116. For the purpose of brevity, the descriptions of these processes are not repeated herein. In some embodiments, the protective structure 105 covers the heterojunction bipolar transistor 130, and the collector electrodes 124 may be partially exposed from the protective structure 105.

In some embodiments, the sub-collector layer 104A under the heterojunction bipolar transistor 130 may be called as a collector mesa, and the etch stop layer 106A, the sub-collector layer 104B, the collector layer 108, and the base layer 110 of the heterojunction bipolar transistor 130 may be called as a base mesa. In some embodiments, at least a portion of the area 202 (e.g. the ring element 103) and the collector mesa are formed in the sub-collector layer 104A. In some embodiments, the ring element 103 may be referred to as a lower portion of the area 202, the base mesa ring 109 may be referred to as an upper portion of the area 202, and the collector mesa and the lower portion of the area 202 are formed in the sub-collector layer 104A. In some embodiments, the base mesa and the upper portion of the area 202 are formed in identical semiconductor layers (e.g. the etch stop layer 106A, the sub-collector layer 104B, the collector layer 108, and the base layer 110) disposed on the sub-collector layer 104A.

In summary, a III-V semiconductor die is provided in some embodiments of the present disclosure. The III-V semiconductor die includes a device area and a doped semiconductor ring region surrounding the device area. At least one active device is formed in the device area. Therefore, crack formed at the edges of the semiconductor die may be easily detected Although embodiments of the present disclosure and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope of such processes, machines, manufacture, and compositions of matter, means, methods, or steps. In addition, each claim constitutes a separate embodiment, and the combination of various claims and embodiments are within the scope of the disclosure.

What is claimed is:

1. A III-V semiconductor die, comprising:
   a device area, wherein at least one active device or at least one passive device is formed in the device area; and
   a doped semiconductor ring region surrounding the device area, wherein the doped semiconductor ring region has a first width, there is a first distance between an edge of the doped semiconductor ring region and an edge of the III-V semiconductor die, and a ratio of the first width to the first distance is between $1/15$ and 2.

2. The III-V semiconductor die as claimed in claim 1, wherein the at least one active device comprises a heterojunction bipolar transistor (HBT), a high electron mobility transistor (HEMT), or a combination thereof.

3. The III-V semiconductor die as claimed in claim 1, further comprising:
   a pair of conductive pads electrically connected to the doped semiconductor ring region.

4. The III-V semiconductor die as claimed in claim 3, wherein the conductive pads are formed at respective diagonal angles of the III-V semiconductor die.

5. The III-V semiconductor die as claimed in claim 3, wherein the doped semiconductor ring region comprises a first portion and a second portion electrically connected in parallel to the conductive pads.

6. A III-V semiconductor die with a device area and a doped semiconductor ring region surrounding the device area, comprising:
   a substrate;
   a sub-collector layer formed on the substrate, wherein the sub-collector layer comprises an insulating region, wherein the insulating region has a different electrical conductivity than the doped semiconductor ring region; and
   a protective layer disposed on the sub-collector layer.

7. The III-V semiconductor die as claimed in claim 6, wherein a heterojunction bipolar transistor (HBT) is formed in the device area and the heterojunction bipolar transistor comprises:
   a collector mesa and a base mesa formed on the collector mesa.

8. The III-V semiconductor die as claimed in claim 7, wherein at least a portion of the doped semiconductor ring region and the collector mesa are formed in the sub-collector layer.

9. The III-V semiconductor die as claimed in claim 7, wherein the doped semiconductor ring region comprises a lower portion and an upper portion on the lower portion, and the collector mesa and the lower portion of the doped semiconductor ring region are formed in the sub-collector layer.

10. The III-V semiconductor die as claimed in claim 9, wherein the base mesa and the upper portion of the doped semiconductor ring region are formed in a semiconductor layer disposed on the sub-collector layer.

11. The III-V semiconductor die as claimed in claim 6, wherein the doped semiconductor ring region is formed between isolation regions of the III-V semiconductor die.

12. The semiconductor structure as claimed in claim 6, wherein the protective layer comprises:
    a first dielectric layer disposed on the sub-collector layer;
    a second dielectric layer disposed on the first dielectric layer; and
    a third dielectric layer disposed on the second dielectric layer and covering a sidewall of the first dielectric layer and a sidewall of the second dielectric layer.

13. The semiconductor structure as claimed in claim 12, wherein the protective layer further comprises a fourth dielectric layer disposed on the third dielectric layer, and a stepped interface is formed between the third dielectric layer and the fourth dielectric layer.

14. The semiconductor structure as claimed in claim 13, wherein a width of the stepped interface is less than a width of the doped semiconductor ring region.

15. The semiconductor structure as claimed in claim 12, wherein the third dielectric layer is in contact with the sub-collector layer.

16. The semiconductor structure as claimed in claim 6, wherein an edge of the doped semiconductor ring region is aligned with an edge of the protective layer.

17. The semiconductor structure as claimed in claim 6, wherein the doped semiconductor ring region is partially covered by the protective layer.

18. The semiconductor structure as claimed in claim 6, wherein the doped semiconductor ring region is fully covered by the protective layer.

* * * * *